(12) United States Patent
Choi

(10) Patent No.: US 11,414,779 B2
(45) Date of Patent: Aug. 16, 2022

(54) GEMSTONE GROWING DEVICE

(71) Applicant: Viea Logis Co., Ltd., Seoul (KR)

(72) Inventor: Chul-Hong Choi, Seoul (KR)

(73) Assignee: VIEA LOGIS CO., LTD., Seoul (KR)

( * ) Notice: Subject to any disclaimer, the term of this patent is extended or adjusted under 35 U.S.C. 154(b) by 217 days.

(21) Appl. No.: 16/668,119

(22) Filed: Oct. 30, 2019

(65) Prior Publication Data
US 2020/0131666 A1  Apr. 30, 2020

(30) Foreign Application Priority Data

Oct. 31, 2018 (KR) .................. 10-2018-0131815

(51) Int. Cl.
| C30B 35/00 | (2006.01) |
| C30B 25/14 | (2006.01) |
| C30B 25/10 | (2006.01) |
| B44C 5/00  | (2006.01) |

(52) U.S. Cl.
CPC .............. C30B 25/14 (2013.01); C30B 25/10 (2013.01); C30B 35/00 (2013.01); B44C 5/00 (2013.01)

(58) Field of Classification Search
CPC ........... A44C 17/00; A44C 27/00; B44C 5/00; C30B 11/10; C30B 25/10; C30B 25/14; C30B 29/04; C30B 29/20
See application file for complete search history.

(56) References Cited

U.S. PATENT DOCUMENTS

| 2,792,287 A * | 5/1957 | Moore, Jr. .............. C30B 11/10 501/86 |
| 3,870,472 A | 3/1975 | Adamski et al. |
| 3,892,540 A * | 7/1975 | Cioccolani .............. C30B 11/10 117/12 |
| 4,419,116 A * | 12/1983 | Nakahara ............ C03B 37/0142 65/158 |
| 2005/0129603 A1* | 6/2005 | Szillat ..................... C03C 12/00 423/335 |
| 2005/0133974 A1* | 6/2005 | Celikkaya ......... C04B 35/62665 266/216 |

FOREIGN PATENT DOCUMENTS

| CN | 1563509 A | 1/2005 |
| JP | 2005179109 A | 7/2005 |
| KR | 20150120716 A | 10/2015 |
| KR | 20170034975 A | 3/2017 |
| KR | 20180059214 A | 6/2018 |

* cited by examiner

Primary Examiner — Matthew J Song
(74) Attorney, Agent, or Firm — Harness, Dickey & Pierce, P.L.C.

(57) ABSTRACT

Provided is a gemstone growing device including: a first pipe; a second pipe disposed below the first pipe and connected to the first pipe; a third pipe configured to surround the second pipe; a mixed material input part disposed in the first pipe; an oxygen input pipe connected to the first pipe; a first hydrogen input pipe connected to the third pipe; and a muffle disposed below the third pipe.

8 Claims, 6 Drawing Sheets

GEMSTONE GROWING DEVICE

CROSS-REFERENCE TO RELATED APPLICATIONS

This U.S. non-provisional patent application claims priority under 35 U.S.C. § 119 of Korean Patent Application No. 10-2018-0131815, filed on Oct. 31, 2018, the entire contents of which are hereby incorporated by reference.

BACKGROUND

The present disclosure herein relates to a gemstone growing device. More particularly, the present disclosure herein relates to a gemstone growing device capable of easily inputting a mixed material and preventing explosion.

People have been researched various methods for remembering a deceased person or pet forever or memorizing a lover or entertainer. In case of foreign countries, a business, which extracts a biological element from a body tissue of a person or pet or from cremation ashes of a corpse of a person or pet and inserts the extracted biological element into a synthetic gemstone such a synthetic ruby or diamond, has been developing. In recent years, a trend of inserting the biological element into a synthetic ruby, which is relatively easy to be manufactured, has been increasing.

A technology, which extracts a biological element from a person or pet and inserts the extracted biological element into a synthetic gemstone, has been developed in only a few advanced countries. In terms of domestic situation, the above-described technology has been slowly developing.

SUMMARY

The present disclosure provides a gemstone growing device capable of easily inputting a mixed material and preventing explosion.

An embodiment of the inventive concept provides a gemstone growing device including: a first pipe; a second pipe disposed below the first pipe and connected to the first pipe; a third pipe configured to surround the second pipe; a mixed material input part disposed in the first pipe; an oxygen input pipe connected to the first pipe; a first hydrogen input pipe connected to the third pipe; and a muffle disposed below the third pipe.

In an embodiment, the gemstone growing device may further include a second hydrogen input pipe connected to the third pipe.

In an embodiment, the gemstone growing device may further include an external air input pipe connected to the third pipe.

In an embodiment, the gemstone growing device may further include a first tapping bar disposed in the mixed material input part, and the mixed material input part may include a mesh net that contacts a lower end of the first tapping bar.

In an embodiment, the gemstone growing device may further include: a second tapping bar connected to the first tapping bar; a cover provided on the mixed material input part and having a groove; a spring provided in the groove; a pressing part provided on a sidewall of the first tapping bar to press the spring; and a third tapping bar configured to collide with the second tapping bar while moving upward and downward. Here, the spring may push the pressing part upward.

In an embodiment, the gemstone growing device may further include: screens provided between the second pipe and the third pipe; and ceramic balls disposed between the screens.

In an embodiment of the inventive concept, a method for driving a gemstone growing device includes: preparing a mixed material by inputting the mixed material into a mixed material input part; forming a preliminary flame by using hydrogen, which is supplied through a first hydrogen input pipe, and air, which is supplied through an external air input pipe; forming a main flame by using hydrogen, which is supplied through a second hydrogen input pipe, and air, which is supplied through an oxygen input pipe; and growing a synthetic gemstone by using the main flame.

In an embodiment, the growing of the synthetic gemstone may include: generating a vibration in a mesh net of the mixed material input part by using a first tapping bar; and melting the mixed material by using the main flame, and the generating of the vibration in the mesh net may include: colliding a second tapping bar with a third tapping bar connected to the first tapping bar by moving the second tapping bar upward and downward; pressing a spring, which is disposed below a pressing part, by the pressing part fixed on a sidewall of the first tapping bar; and pushing the pressing part upward by the spring.

In an embodiment, the method may further include performing a purging, and the performing of the purging may include: supplying air into the gemstone growing device through the external air input pipe; and removing foreign substances and the hydrogen, which are remained in the gemstone growing device.

In an embodiment, the forming of the preliminary flame may include forming the preliminary flame by using a spark plug provided on a sidewall of the external air input pipe, and the forming of the main flame may include stopping the supply of the hydrogen through the first hydrogen input pipe and stopping the supply of the air through the external air input pipe.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
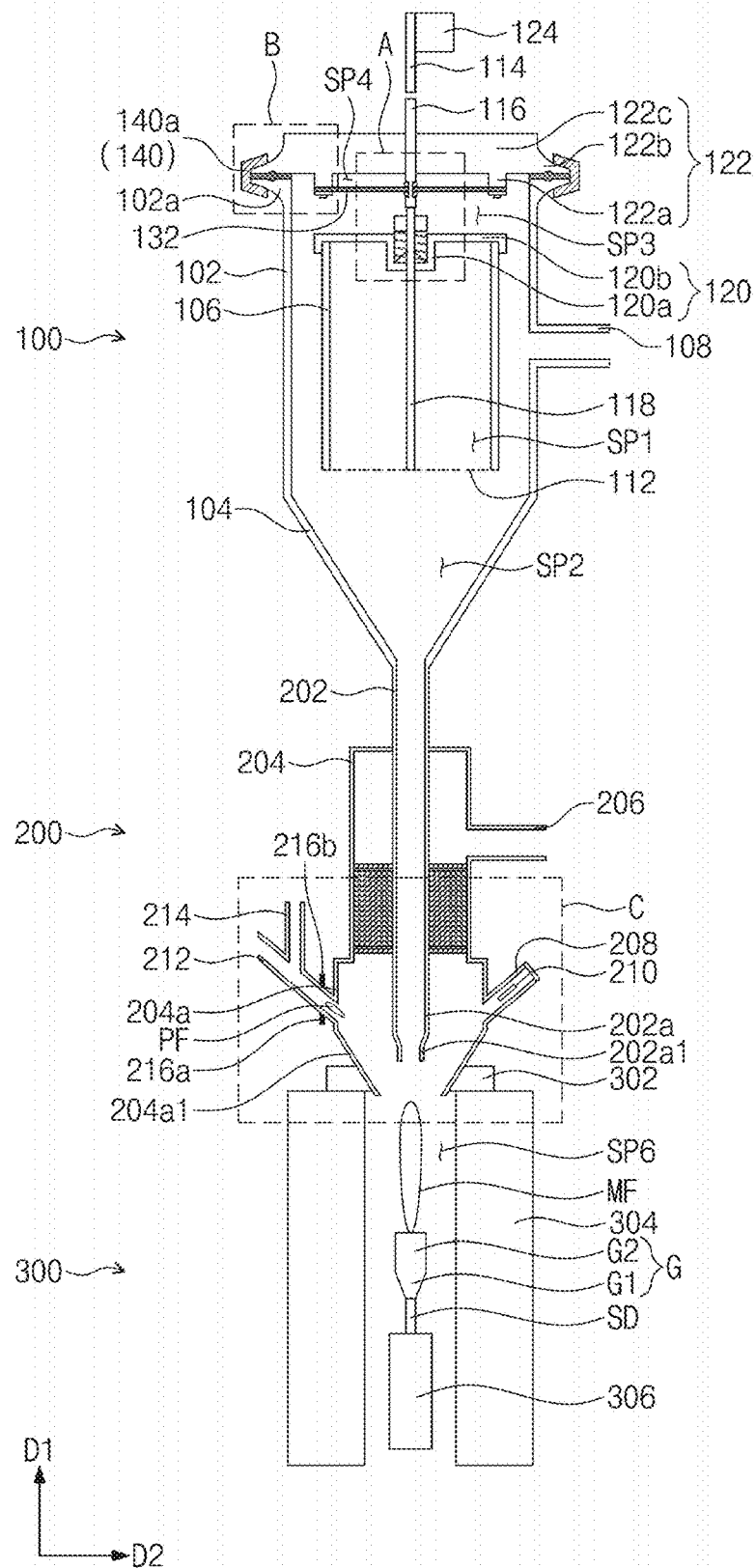
FIG. 1 is a cross-sectional view illustrating a gemstone growing device according to an embodiment of the inventive concept.

Advantages and features of the present invention, and implementation methods thereof will be clarified through following embodiments described with reference to the accompanying drawings. The present invention may, however, be embodied in many different forms and should not be construed as being limited to the embodiments set forth herein. Rather, these embodiments are provided so that this disclosure will be thorough and complete, and will fully convey the concept of the invention to those skilled in the art. Further, the present invention is only defined by scopes of claims. Like reference numerals refer to like elements throughout.

In the following description, the technical terms are used only for explaining a specific exemplary embodiment while not limiting the present disclosure. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Hereinafter, exemplary embodiments will be described in detail with reference to the accompanying drawings.

Figure 2:
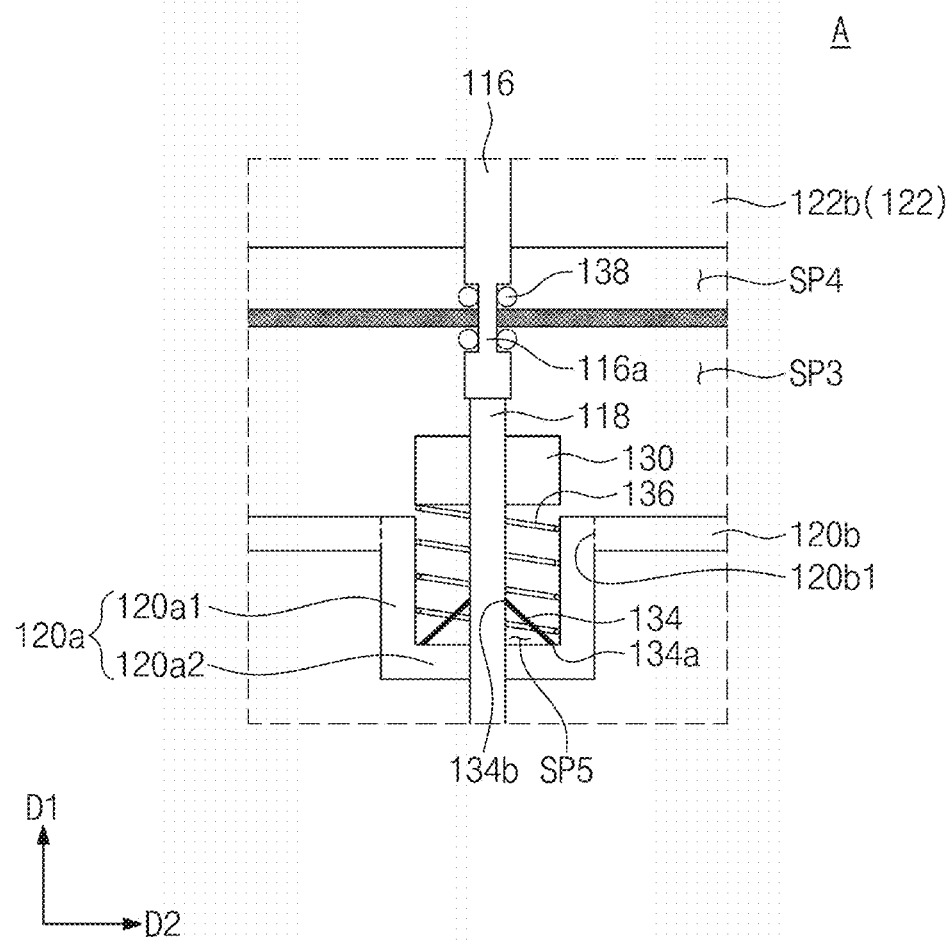
FIG. 2 is an enlarged view illustrating region A of FIG. 1.
Figure 3:
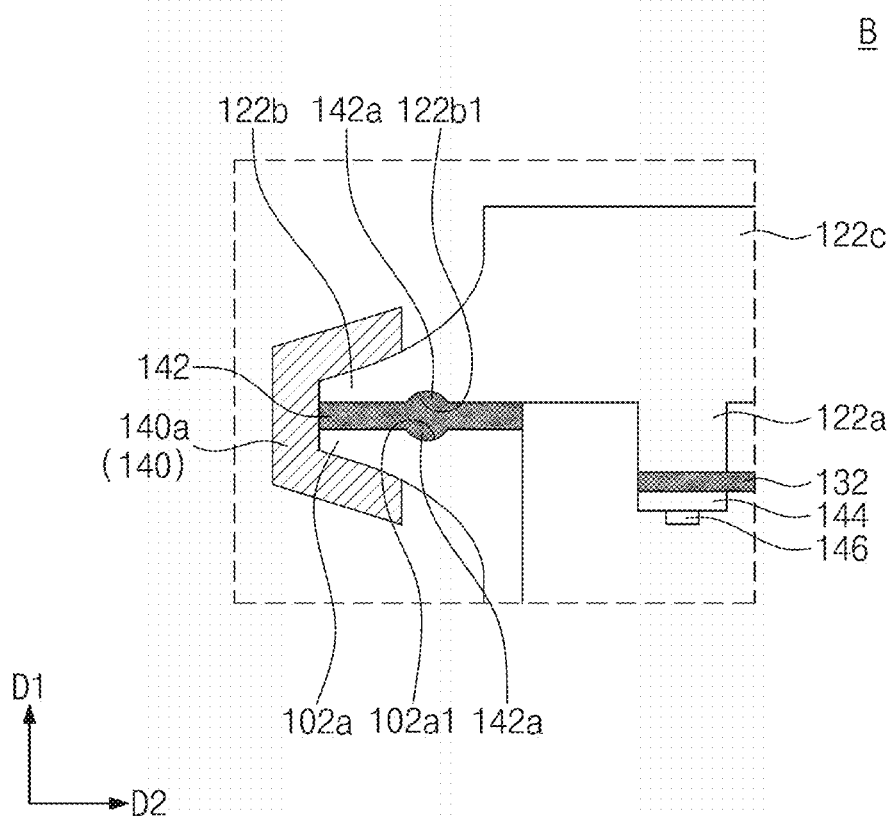
FIG. 3 is an enlarged view illustrating region B of FIG. 1.
Figure 4:
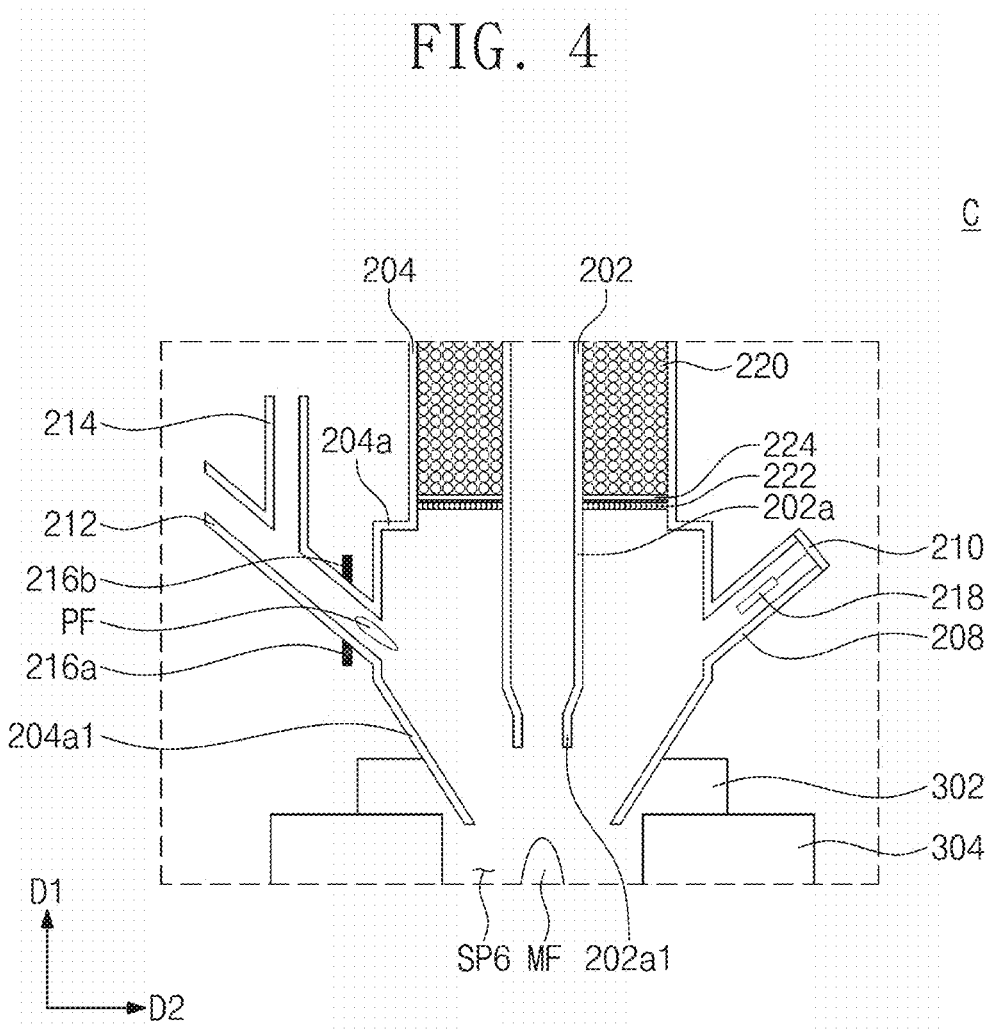
FIG. 4 is an enlarged view illustrating region C of FIG. 1.
Figure 5:
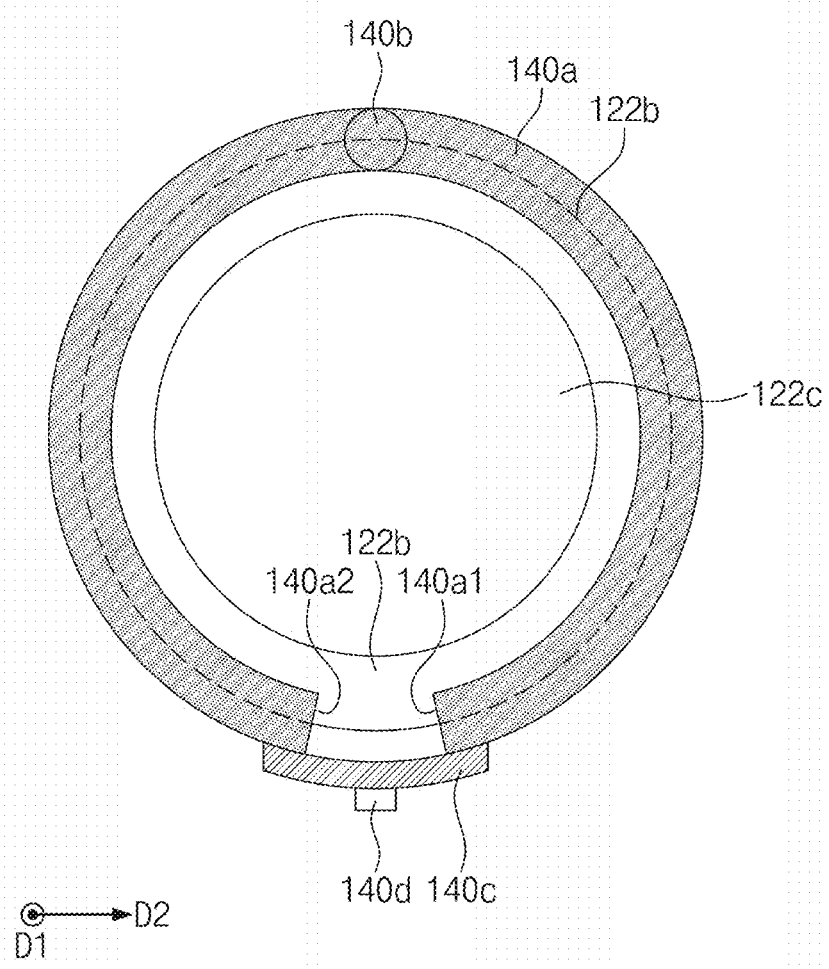
FIG. 5 is a plan view for explaining a clamp.

FIG. 1 is a cross-sectional view illustrating a gemstone growing device according to an embodiment of the inventive concept. FIG. 2 is an enlarged view illustrating region A of FIG. 1. FIG. 3 is an enlarged view illustrating region B of FIG. 1. FIG. 4 is an enlarged view illustrating region C of FIG. 1. FIG. 5 is a plan view for explaining a clamp.

Referring to FIG. 1, the gemstone growing device according to an embodiment of the inventive concept may include a material input unit 100, a spark unit 200, and a gemstone growing unit 300. The gemstone growing unit 300 may be disposed below the spark unit 200.

A mixed material and oxygen may be inputted to the material input unit 100. The mixed material may include a gemstone material and a biological material. The gemstone material may include at least one of aluminum oxide and silicon magnesium oxide. The biological material may be extracted from a body tissue of a person or an animal or from cremation ashes of a corpse of a person or an animal.

Hydrogen and air may be inputted to the spark unit 200. A preliminary flame PF may be formed in the spark unit 200 by the hydrogen and air.

A main flame MF may be formed in the gemstone growing unit 300. The main flame MF may be formed when the preliminary flame PF meets hydrogen and oxygen. A synthetic gemstone G may be grown by the main flame MF.

Referring to FIGS. 1 to 3, the material input unit 100 may include a first pipe 102, a hopper 104, a mixed material input part 106, an oxygen input pipe 108, a first tapping bar 114, a second tapping bar 116, a third tapping bar 118, a first cover 120, a second cover 122, a solenoid valve 124, a pressing part 130, a first rubber pad 132, a second rubber pad 134, a spring 136, O-rings 138, a clamp 140, a third rubber pad 142, a support ring 144, and couplers 146.

The first pipe 102 may extend in a first direction D1. The first pipe 102 may have a lower portion connected to an upper portion of the hopper 104. The first pipe 102 may include a first connection part 102a at an upper portion thereof. The first connection part 102 may have a curved bottom surface. The first connection part 102a may include a first connecting groove 102a1 at a top surface thereof. The hopper 104 may have a funnel shape. The hopper 104 may have a width that gradually decreases in a second direction D2. The mixed material input part 106 may be disposed in the first pipe 102.

An inner space of the mixed material input part 106 may be defined as a first space SP1. An inner space of the hopper 104 may be defined as a second space SP2. The mixed material input part 106 may include a mesh net 112. The mesh net 112 may be provided at a lower portion of the mixed material input part 106. The first cover 120 may be provided on the mixed material input part 106. The first cover 120 may close an upper portion of the mixed material input part 106. The first space SP1 may be a space surrounded by the mixed material input part 106 and the first cover 120.

The mesh net 112 may include a plurality of openings. The first space S1 may communicate with the second space S2 through the openings. The first space S1 may be separated from the third space SP3 above the mixed material input part 106 by the first cover 120.

The mixed material may be inputted into the first space SP1. The mixed material inputted in the first space SP1 may not move to the second space SP2 by the mesh net 112. When the mesh net 112 is vibrated, the mixed material may move to the second space SP2 through the openings of the mesh net 112.

The first cover 120 may include a first groove 120a and a first base 120b. The first groove 120a may include a sidewall 120a1 and a bottom wall 120a2. An upper portion of the sidewall 120a1 of the first groove 120a may be connected to an inner wall 120b1 of the first base 120b. The bottom wall 120a2 of the first groove 120a may be connected to a lower portion of the sidewall 120a1 of the first groove 120a. The second rubber pad 134 and the spring 136 may be provided in the first groove 120a.

An oxygen input pipe 108 may be connected to a sidewall of the first pipe 102. Oxygen may be supplied through the oxygen input pipe 108. The oxygen input pipe 108 may extend in the second direction D2.

The second cover 122 may be provided on the first pipe 102. The second cover 122 may close the upper portion of the first pipe 102. A space in the first pipe 102 and a space above the first pipe 102 may be separated by the second cover 122.

The second cover 122 may include a protruding part 122a, a second connection part 122b, and a second base 122c. The protruding part 122a may extend downward from a bottom surface of the second base 122c. The protruding part 122a may have a doughnut shape on a plane. The second connection part 122b may extend from a sidewall of the second base 122c to the outside. The second connection part 122b may surround the second base 122c on the plane. The second connection part 122b may have a curved top surface. The second connection part 122b may include a second connecting groove 122b1 at a bottom surface thereof.

Referring to FIGS. 3 and 5, the clamp 140 may have a doughnut shape on the plane. The clamp 140 may include a coupling part 140a, a hinge 140b, a fastening part 140c, and a fastening screw 140d. The coupling part 140a may be coupled to a first coupling part 102a of the first pipe 102 and a second connection part 122b of the second cover 122. The coupling part 140a may press a bottom surface of the first connection part 102a and a top surface of the second connection part 122b. When the coupling part 140a is coupled, the first connection part 102a and the second connection part 122b may be fixed to each other and thus may not be separated from each other.

The coupling part 140a may include a first end 140a1 and a second end 140a2. The first end 140a1 and the second end 140a2 of the coupling part 140a may be spaced apart from or adjacent to each other by a hinge 140b. When the first end 140a1 and the second end 140a2 are spaced apart from each other, coupling of the coupling part 140a with respect to the first connection part 102a and the second connection part 122b may be released. When the coupling is released, the first connection part 102a and the second connection part 122b may be separated from each other.

A third rubber pad 142 may be provided between the first connection part 102a and the second connection part 122b. The third rubber pad 142 may have a doughnut shape on the plane. The third rubber pad 142 may include protruding patterns 142a that protrude upward and downward. Each of the protruding patterns 142a may have a doughnut shape on the plane. Each of the protruding patterns 142a may be inserted into a first connection groove 102a1 of the first connection part 102a and a second connection groove 122b1 of the second connection part 122b.

The fastening part 140c may connect the first end 140a1 and the second end 140a2 of the coupling part 140a to each other. The fastening part 140c may prevent the coupling of the coupling part 140a from being released by connecting the first end 140a1 and the second end 140a2 to each other.

The fastening part 140c may have a length that increases or decreases by the fastening screw 140d. The length of the fastening part 140c may be appropriately adjusted by adjusting the fastening screw 140d.

Referring to FIGS. 1 to 3 again, the first tapping bar 114 may be provided on the second cover 122. The first tapping bar 114 may extend in the first direction D1. A solenoid valve 124 may be connected to the first tapping bar 114. The first tapping bar 114 may vertically move in the first direction D1 by the solenoid valve 124.

The second tapping bar 116 may be provided below the first tapping bar 114. The second tapping bar 116 may extend in the first direction D1. The second tapping bar 116 may be spaced apart from the first tapping bar 114 in the first direction D1. The second tapping bar 116 may pass through the second base 122c of the second cover 122.

The second tapping bar 116 may include an undercut 116a. The undercut 116a may be a portion having a relatively small width in the second direction D2. The O-rings 138 and the first rubber pad 132 may be provided on a sidewall of the undercut 116a. The first rubber pad 132 may be provided between two O-rings 138. The first rubber pad 132 may be fixed by the two O-rings 138. The undercut 116a of the second tapping bar 116 may pass through the first rubber pad 132.

The first rubber pad 132 may have a doughnut shape on the plane. The first rubber pad 132 may have a top surface contacting a bottom surface of the protruding part 122a of the second cover 122. The support ring 144 may be provided on a bottom surface of the first rubber pad 132. The support ring 144 may have a doughnut shape on the plane. The support ring 144 may support the first rubber pad 132. The couplers 146 may be provided on a bottom surface of the support ring 144. For example, the couplers 146 may be bolts. The couplers 146 may pass through the first rubber pad 132 and the support ring 144 and be inserted into the protruding part 122a of the second cover 122. The first rubber pad 132 and the support ring 144 may be fixed by the couplers 146. For example, six couplers 146 may be provided while being spaced a predetermine distance from each other.

The space between the first cover 120 and the second cover 122 may be separated into the third space SP3 and the fourth space SP4 by the first rubber pad 132. The third space SP3 may be a space below the first rubber pad 132. The fourth space SP4 may be a space above the first rubber pad 132. The fourth space SP4 may be a space surrounded by the first rubber pad 132, the protruding part 122a of the second cover 122, and the second base 122c of the second cover 122. The first rubber pad 132 may prevent a mixed material and oxygen disposed below the first rubber pad 132 from moving to the fourth space 4. The mixed material and the oxygen may be prevented from being leaked to the outside of the gemstone growing device by the first rubber pad 132.

The third tapping bar 118 may be provided below the second tapping bar 116. The third tapping bar 118 may extend in the first direction D1. The third tapping bar 118 may have an upper end contacting a lower end of the second tapping bar 116. The third tapping bar 118 may pass through the bottom wall 120a2 of the first groove 120a of the first cover 120. The third tapping bar 118 may include an undercut (not shown). The third tapping bar 118 may have a lower portion provided in the mixed material input part 106. The third tapping bar 118 may have a lower end contacting the mesh net 112.

The pressing part 130 may be provided on a sidewall of the third tapping bar 118. The third tapping bar 118 may pass through the pressing part 130. The pressing part 130 may be fixed to the third tapping bar 118. The pressing part 130 may have a lower portion contacting an upper portion of the spring 136 provided in the first groove 120a of the first cover 120.

The spring 136 may contact the sidewall 120a1 of the bottom wall 120a2 of the first groove 120a. The spring 136 may surround the third tapping bar 118 on the plane.

The second rubber pad 134 may have a doughnut shape on the plane. The second rubber pad 134 may include an outer circumferential wall 134a and an inner circumferential wall 134b. The inner circumferential wall 134b of the second rubber pad 134 may contact the third tapping bar 118. The outer circumferential wall 134a of the second rubber pad 134 may contact the first groove 120a of the first cover 120. The inner circumferential wall 134b of the second rubber pad 134 may be inserted and fixed to the undercut (not shown) of the third tapping bar 118.

A fifth space SP5 may be defined by the second rubber pad 134. The fifth space SP5 may be a space surround by the second rubber pad 134, the third tapping bar 118, and the bottom wall 120a2 of the first groove 120a. The fifth space SP5 may be sealed by the second rubber pad 134. In other words, the second rubber pad 134 may prevent the mixed material below the second rubber pad 134 from moving above the second rubber pad 134.

Referring to FIGS. 1 and 4, the spark unit 200 may include a second pipe 202, a third pipe 204, a first hydrogen input pipe 206, a sensor disposed pipe 208, a third cover 210, an external air input pipe 212, a second hydrogen input pipe 214, spark plugs 216a and 216b, a flame sensor 218, ceramic balls 220, screens 222, and filters 224.

The second pipe 202 may extend in the first direction D1. The second pipe 202 may have an upper portion connected to a lower portion of the hopper 104. The second pipe 202 may include a first nozzle part 202a at a lower portion thereof. The first nozzle part 202a may include a lower end 202a1 having a width that gradually decreases in the second direction D2.

The third pipe 204 may extend in the first direction D1. The third pipe 204 may surround the second pipe 202 on the plane. The third pipe 204 may include a second nozzle part 204a at a lower portion thereof. The second nozzle part 204a may surround the first nozzle part 202a of the second pipe 202 on the plane. The third pipe 204 may have a width, which gradually increases in the second direction D2, at the second nozzle part 204a. The second nozzle part 204a may include a lower end 204a1 having a width that gradually decreases in the second direction D2.

The first hydrogen input pipe 206 may be connected to a sidewall of the third pipe 204. Hydrogen may be supplied through the first hydrogen input pipe 206. The first hydrogen input pipe 206 may extend in the second direction D2.

The sensor disposed pipe 208 may be connected to a sidewall of the second nozzle part 204a of the third pipe 204. The sensor disposed pipe 208 may be disposed below the first hydrogen input pipe 206. The flame sensor 218 may be provided in the sensor disposed pipe 208. The flame sensor 218 may detect a flame. The third cover 210 may close an upper portion of the sensor disposed pipe 208. The flame sensor 218 may be connected to an external electric circuit by an electric line (not shown) passing through the third cover 210. The sensor disposed pipe 208 may extend in a direction crossing the first and second directions D1 and D2. For example, the sensor disposed pipe 208 may extend in a direction having an inclination of 45° with respect to the first direction D1.

The external air input pipe 212 may be connected to a sidewall of the second nozzle part 204a of the third pipe 204. Air may be supplied through the external air input pipe 212. The external air input pipe 212 may extend in a direction crossing the first and second directions D1 and D2. For example, the external air input pipe 212 may extend in a direction having an inclination of 45° with respect to the first direction D1. As the external air input pipe 212 is inclined with respect to the second nozzle part 204a of the third pipe 204, the mixed material may be prevented from being stacked in the external air input pipe 212.

The second hydrogen input pipe 214 may be connected to a sidewall of the external air input pipe 212. Hydrogen may be supplied through the second hydrogen input pipe 214. The second hydrogen input pipe 214 may extend in the first direction D1.

One pair of spark plugs 216a and 216b may be provided on the sidewall of the external air input pipe 212. The spark plugs 216a and 216b may spark a flame by using hydrogen and air.

The ceramic balls 220 may be provided between the second pipe 202 and the third pipe 204. Hydrogen supplied in the third pipe 204 may pass through the ceramic balls 220 through a space between the ceramic balls 220.

The filters 224 may be provided between the second pipe 202 and the third pipe 204. Each of the filters 224 may have a doughnut shape on the plane. The ceramic balls 220 may be disposed between the filters 224. The second pipe 202 may pass through the filters 224. The filters 224 may contact an outer wall of the second pipe 202 and an inner wall of the third pipe 204. For example, the filters 224 may include a polyester non-woven fabric. The hydrogen supplied in the third pipe 204 may pass through the filters 224. The ceramic balls between the filters 224 may be broken to generate dusts. The dusts may not pass through the filters 224. In other words, the dusts may be blocked by the filters 224.

The screens 222 may be provided between the second pipe 202 and the third pipe 204. The screens 222 may have a doughnut shape on the plane. The ceramic balls 220 and the filters 224 may be disposed between the screens 222. The second pipe 202 may pass through the screens 222. The screens 222 may contact the outer wall of the second pipe 202 and the inner wall of the third pipe 204. The screens 222 may include a plurality of openings. Each of the openings may have a size less than that of each of the ceramic balls 220.

The gemstone growing unit 300 may include a sealing part 302, a muffle 304, and a support 306.

The muffle 304 may be provided below the second nozzle part 204a of the third pipe 204. A sixth space SP6 may be defined in the muffle 304. The sixth space SP6 may be a space below the lower end 204a1 of the second nozzle part 204a of the third pipe 204. The sixth space SP6 may communicate with an inner space of the third pipe 204 through the lower end 204a1 of the second nozzle part 204a of the third pipe 204.

The sealing part 302 may be provided between an outer wall of the lower end 204a1 of the second nozzle part 204a of the third pipe 204 and the muffle 304. The sealing part 302 may fix the third pipe 204. The sealing part 302 may seal the sixth space SP6 in the muffle 304 so that the sixth space SP6 in the muffle 304 is not in communication with an external space above the muffle 304.

The support 306 may vertically move in the first direction D1. The support 306 may move in the sixth space in the muffle 304 from an external space below the muffle 304 and move out from the sixth space SP6 in the muffle 304 to the external space below the muffle 304. A crystal seed SD may be provided on the support 306. The crystal seed SD may be a seed of a synthetic gemstone to be grown.

Figure 6:
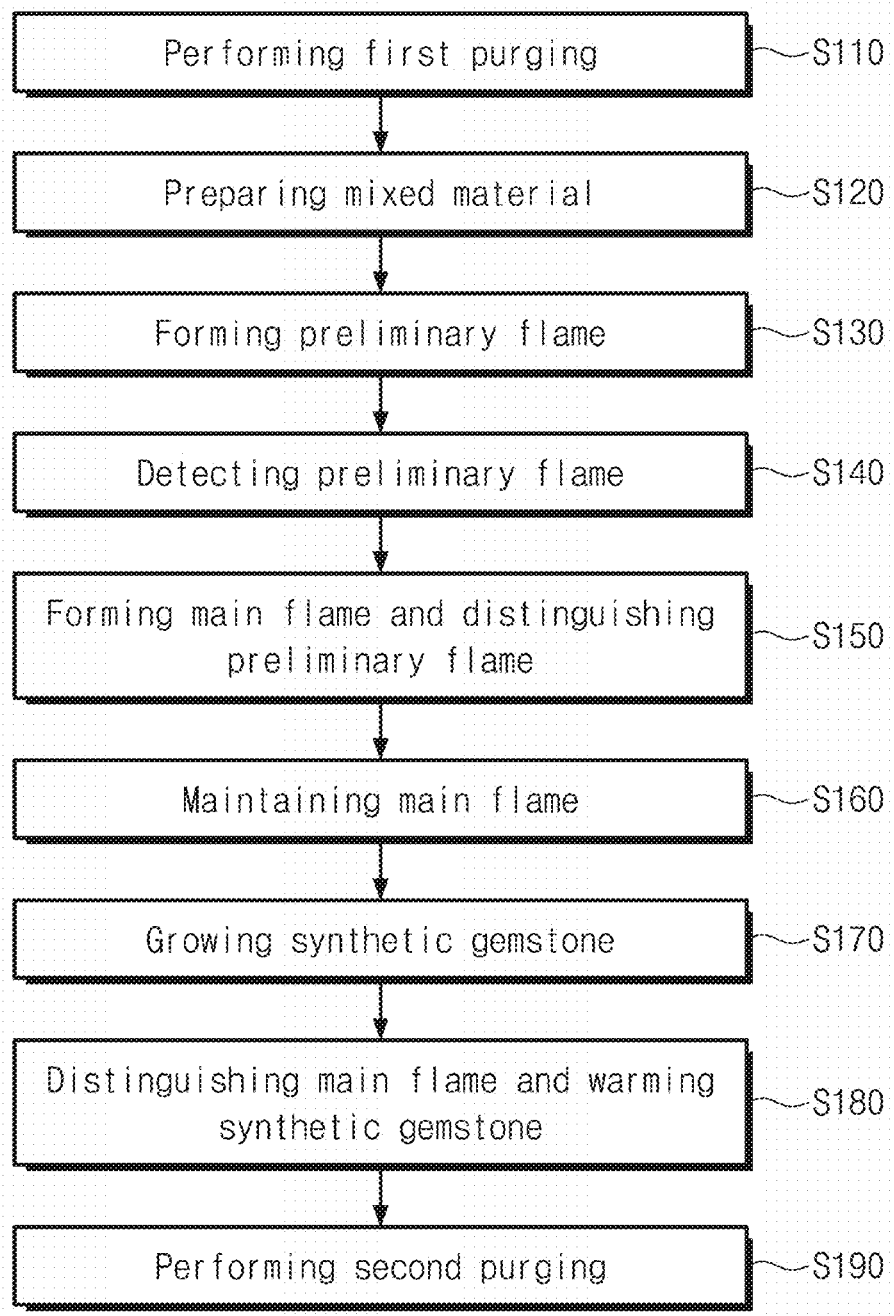
FIG. 6 is a flowchart for explaining a method for driving the gemstone growing device according to an embodiment of the inventive concept.

FIG. 6 is a flowchart for explaining a process of driving a gemstone growing device according to an embodiment of the present invention.

Referring to FIGS. 1 to 6, a method for driving the gemstone growing device according to an embodiment of the present invention may include performing a first purging in operation S110, preparing a mixed material in operation S120, forming a preliminary flame FP in operation S130, detecting the preliminary flame FP in operation S140, forming a main flame MF and extinguishing the preliminary flame PF in operation S150, maintaining the main flame MF in operation S160, growing a synthetic gemstone G in operation S170, extinguishing the main flame MF and warming the synthetic gemstone G in operation S180, and performing a second purging in operation S190.

Firstly, the first purging may be performed in operation S110. The performing of the first purging in operation S110 may include supplying air through the external air input pipe 212. The supplying of air may remove foreign substances, oxygen, and hydrogen, which are remained in the gemstone growing device. Accordingly, explosion due to the oxygen and hydrogen remained the gemstone growing device may be prevented. After the performing of the first purging in operation S110, the mixed material may be prepared in operation S120. The preparing of the mixed material in operation S120 may include separating the second cover 122, separating the first cover 120, inputting the mixed material into the first space SP1, coupling the first cover 120, and coupling the second cover 122.

The coupling of the second cover 122 may include releasing coupling between the coupling part 140a and the fastening part 140c of the clamp 140, releasing coupling between the coupling part 140a of the clamp 140, the first connection part 102a of the first pipe 102, and the second connection part 122b of the second cover 122, and separating the first connection part 102a and the second connection part 122b. As the second cover 122 is separated, the second tapping bar 116, the O-rings 138, and the first rubber pad 132 may be separated together. In other words, an integrated body of the second tapping bar 116, the O-rings 138, and the first rubber pad 132 may be separated. During this process, the second tapping bar 116 and the third tapping bar 118 may be separated from each other.

The separation of the first cover 120 may include separating the pressing part 130 from the third tapping bar 118 and separating the first cover 120 from the mixed material input part 106. As the first cover 120 is separated, the spring 136 and the second rubber pad 134 may be separated together from the mixed material input part 106. In other words, an integrated body of the first cover 120, the spring 136, and the second rubber pad 134 may be separated from the mixed material input part 106.

When the first cover 120 is separated, as the mixed material input part 106 is opened, and the mixed material may be input into the first space SP1 in the mixed material input part 106. After the inputting of the mixed material, the first cover 120 and the second cover 122 may be re-coupled to each other.

The gemstone growing device according to an embodiment of the inventive concept may easily input the mixed material into the mixed material input part 106 because the first cover 120 and the second cover 122 are easily separated from and coupled to each other.

After the preparing of the mixed material in operation S120, the preliminary flame FP may be formed in operation S130. The forming of the preliminary flame PF in operation S130 may include supplying air to the second nozzle part 204a of the third pipe 204 through the external air input pipe 212, supplying hydrogen to the second nozzle part 204a of the third pipe 204 through the second hydrogen input pipe 214, and sparking a flame by using the spark plugs 216a and 216b. The preliminary flame PF may be formed at a portion at which the external air input pipe 212 is connected to the second nozzle part 204a of the third pipe 204. The preliminary flame PF may be sparked by hydrogen supplied from the second hydrogen input pipe 214 and air supplied from the external air input pipe 212. The air may contain oxygen.

When the preliminary flame PF is formed in operation S130, the preliminary flame PF may be detected in operation S140. The detecting of the preliminary flame PF in operation S140 may include detecting the preliminary flame PF by the flame sensor 218 disposed in the sensor disposed pipe 208. For example, the flame sensor 218 may detect whether the preliminary flame PF is maintained for about five seconds. When hydrogen and oxygen are supplied through the first hydrogen input pipe 206 and the oxygen input pipe 108 in a state in which the preliminary flame PF is not formed, oxygen and hydrogen may be excessively supplied in the gemstone growing device, and thus risk of explosion may increase. When explosion occurs in the gemstone growing device, the gemstone growing device may be damaged, and people around the gemstone growing device may be also damaged. The explosion may be prevented by supplying hydrogen and oxygen only in a state in which the preliminary flame PF is formed through the flame sensor 218.

The forming of the main flame MF and extinguishing the preliminary flame PF in operation S150 may include: supplying hydrogen below the lower end 204a1 of the nozzle part 204a of the third pipe 204 through the first hydrogen input pipe 206; supplying oxygen below the lower end 204a1 of the nozzle part 204a of the third pipe 204 through the oxygen input pipe 108; stopping the supply of hydrogen through the second hydrogen input pipe 214; and stopping the supply of air through the external air input pipe 212.

As the hydrogen and the oxygen, which are supplied by the first hydrogen input pipe 206 and the oxygen input pipe 108, meet the preliminary flame PF, the main flame MF may be formed. The main flame MF may be formed in the sixth space SP6. The hydrogen supplied through the first hydrogen input pipe 206 may pass through portions between the ceramic balls 220. The hydrogen supplied through the first hydrogen input pipe 206 may not form a vortex by the ceramic balls 220. When the main flame MF is formed in the sixth space SP6, the supply of hydrogen through the second hydrogen input pipe 214 and the supply of air through the external air supply pipe 212 may be stopped.

When the main flame MF is formed in operation S150, the main flame MF may be maintained in operation S160. The maintaining of the main flame MF in operation S160 may include: maintaining the main flame MF in the sixth space SP6 by continuously supplying hydrogen and oxygen through the first hydrogen input pipe 206 and the oxygen input pipe 108; and heating the crystal seed SD by the main flame MF. As the main flame MF is maintained in the sixth space SP6, the sixth space SP6 may be heated. In other words, the sixth space SP6 may increase in temperature. The heating of the crystal seed SD by the main flame MF may include allowing the support 306 to ascend so that the main flame MF contacts the crystal seed SD. For example, the support 306 may ascend so that a lowermost portion of a blue portion of the main flame MF contacts an uppermost portion of the crystal seed SD. As heated, the uppermost portion of the crystal seed SD may be melted, and a diameter thereof may be expanded.

When the uppermost portion of the crystal seed SD is melted, the synthetic gemstone G may be grown in operation S170. The growing of the synthetic gemstone G in operation S170 may include: supplying the mixed material from the first space SP1 in the mixed material input part 106 to the sixth space SP6; growing a first portion G1 of the synthetic gemstone G; and growing a second portion G2 of the synthetic gemstone G.

The supply of the mixed material from the first space SP1 in the mixed material input part 106 to the sixth space SP6 may include moving the first tapping bar 114 upward and downward in a periodic manner by using the solenoid valve 124. The first tapping bar 114 may have a vertical movement frequency and a movement speed that is adjusted by the solenoid valve 124. As the first tapping bar 114 moves upward and downward, the first tapping bar 114 may collide with the second tapping bar 116. As the second tapping bar 116 collides with the first tapping bar 114, the second tapping bar 116 and the third tapping bar 118 may move downward. As the third tapping bar 118 moves downward, the pressing part 130 fixed to the third tapping bar 118 may move downward, and thus the pressing part 130 may press the spring 136. The pressed spring 136 may push the pressing part 130 upward again, and the second tapping bar 116 and the third tapping bar 118 may move upward again. In conclusion, as the first tapping bar 114 moves upward and downward, the third tapping bar 118 may move upward and downward. As the third tapping bar 118 moves upward and downward, vibration may be generated in the mesh net 112. As the vibration is generated in the mesh net 112, the mixed material in the mixed material input part 106 may pass through the openings of the mesh net 112 and move to the second space SP2 in the hopper 104. The mixed material moved to the second space SP2 may move to the sixth space SP6 by oxygen. In other words, the oxygen supplied through the oxygen input pipe 108 may serve as a carrying gas of the mixed material.

The mixed material supplied to the sixth space SP6 may be melted by the main flame MF. The mixed material melted by the main flame MF may be arrived on the uppermost portion of the melted crystal seed SD, and the first portion G1 of the synthetic gemstone G may be grown. As the first portion G1 of the synthetic gemstone G is grown, a diameter thereof may increase. As an amount of the oxygen supplied through the oxygen input pipe 108 gradually increases, the first portion G1 of the synthetic gemstone G may be grown to increase the diameter thereof. As the first portion G1 of the synthetic gemstone G may be grown, the support 306 may descend. As the support 306 descends, the first portion G1 of the synthetic gemstone G may be grown to maintain the state in which the uppermost portion of the first portion G1 of the synthetic gemstone G contacts the lowermost portion of the blue portion of the main flame MF. In other words, the support 306 may descend as the synthetic gemstone G is grown.

The second portion G2 may be grown on the first portion G1 of the synthetic gemstone G. The second portion G2 of the synthetic gemstone G may be grown to constantly maintain a diameter thereof. As the amount of the oxygen supplied through the oxygen input pipe 108 is constantly maintained, the second portion G2 of the synthetic gemstone G may be grown to constantly maintain the diameter thereof. As the second portion G2 of the synthetic gemstone G is grown, the support 306 may descend. As the support 306 descends, the second portion G2 of the synthetic gemstone G may be grown to maintain a state in which an uppermost portion of the second portion G2 of the synthetic gemstone contacts the lowermost portion of the blue portion of the main flame MF.

When the synthetic gemstone G is completely grown in operation S170, the main flame MF may be extinguished, and the synthetic gemstone G may be warmed in operation S180. The extinguishing of the main flame MF may include stopping the supply of hydrogen and oxygen through the first hydrogen input pipe 206 and the oxygen input pipe 108. The warming of the synthetic gemstone G may include withdrawing the synthetic gemstone G from the sixth space DP6 in a relatively slow manner. As the synthetic gemstone G is withdrawn from the sixth space SP6 in a relatively slow manner, an internal stress of the synthetic gemstone G may be reduced.

When the synthetic gemstone G is withdrawn from the sixth space SP6, a second purging may be performed in operation S190. The performing of the second purging in operation S190 may include supplying air through the external air input pipe 212. The supplying of air through the external air input pipe 212 may remove foreign substances, oxygen, and hydrogen, which are remained in the gemstone growing device. Thus, explosion caused by the oxygen and hydrogen remained in the gemstone growing device may be prevented.

Since the gemstone growing device according to the embodiment of the inventive concept includes the tapping bars, which are separated from each other, the mixed material may be easily input.

As the gemstone growing device according to the embodiment of the inventive concept includes the external air input pipe and the flame sensor, explosion caused by the hydrogen and oxygen in the gemstone growing device may be prevented.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A gemstone growing device comprising:
    a first pipe;
    a second pipe disposed below the first pipe and connected to the first pipe;
    a third pipe configured to surround the second pipe;
    a mixed material input part disposed in the first pipe;
    an oxygen input pipe connected to the first pipe;
    a first hydrogen input pipe connected to the third pipe;
    ceramic balls between the first hydrogen input pipe and a lower opening of the second pipe; and
    a muffle disposed below the third pipe.

2. The gemstone growing device of claim 1, further comprising a second hydrogen input pipe connected to the third pipe.

3. The gemstone growing device of claim 2, wherein the second hydrogen input pipe is on an external air input pipe connected to the third pipe.

4. The gemstone growing device of claim 1, further comprising an external air input pipe connected to the third pipe.

5. The gemstone growing device of claim 1, further comprising a first tapping bar disposed in the mixed material input part,
    wherein the mixed material input part comprises a mesh net that contacts a lower end of the first tapping bar.

6. The gemstone growing device of claim 1, further comprising:
    screens provided between the second pipe and the third pipe; and
    the ceramic balls disposed between the screens.

7. The gemstone growing device of claim 1, further comprising:
    a first tapping bar disposed in the mixed material input part, wherein the mixed material input part comprises a mesh net that contacts a lower end of the first tapping bar;
    a cover provided on the mixed material input part and having a groove;
    a spring provided in the groove;
    a pressing part on the first tapping bar configured to press the spring into the cover; and
    wherein the spring is configured to vibrate the mesh net.

8. A gemstone growing device further comprising:
    a first pipe;
    a second pipe disposed below the first pipe and connected to the first pipe;
    a third pipe configured to surround the second pipe;
    a mixed material input part disposed in the first pipe;
    an oxygen input pipe connected to the first pipe;
    a first hydrogen input pipe connected to the third pipe;
    a muffle disposed below the third pipe;
    a first tapping bar disposed in the mixed material input part,
    a second tapping bar connected to the first tapping bar;
    a cover provided on the mixed material input part and having a groove;
    a spring provided in the groove;
    a pressing part provided on a sidewall of the first tapping bar, the pressing part configured to press the spring; and
    a third tapping bar configured to collide with the second tapping bar while moving upward and downward,
    wherein the mixed material input part comprises a mesh net that contacts a lower end of the first tapping bar,
    wherein the spring is configured to press the pressing part upward.

* * * * *